United States Patent [19]
Sung

[11] Patent Number: 5,783,473
[45] Date of Patent: Jul. 21, 1998

[54] STRUCTURE AND MANUFACTURING PROCESS OF A SPLIT GATE FLASH MEMORY UNIT

[75] Inventor: Kuo-Tung Sung, Hsinchu, Taiwan

[73] Assignee: Mosel Vitelic, Inc., Hsinchu, Taiwan

[21] Appl. No.: 777,276

[22] Filed: Jan. 6, 1997

[51] Int. Cl.[6] .............................. H01L 21/8247
[52] U.S. Cl. ............................. 438/265; 438/266
[58] Field of Search .................. 438/257, 264, 438/265, 266, 267, 593, 594

[56] References Cited

U.S. PATENT DOCUMENTS

| | | | |
|---|---|---|---|
| 5,330,938 | 7/1994 | Camerlenghi | 438/266 |
| 5,457,061 | 10/1995 | Hong et al. | 438/265 |
| 5,665,620 | 9/1997 | Nguyen et al. | 438/265 |

*Primary Examiner*—Chandra Chaudhari
*Attorney, Agent, or Firm*—Townsend and Townsend and Crew LLP

[57] ABSTRACT

A split gate flash memory manufacturing process comprises the steps of: (a) providing a silicon substrate having a first insulating layer, and forming a first conductive layer on said first insulating layer, and forming a third insulating layer on said first conductive layer; (b) removing part of said third insulating layer and part of said first conductive layer to expose left and right sidewalls of said first conductive layer and part area of said first insulating layer; (c) performing an oxidation process to form a second insulating layer on left and right sidewalls of said first conductive layer and on said part area of said first insulating layer, wherein by a blocking function of the third insulating layer on said second insulating layer an asperity effect on left and right edges of said first conductive layer is reduced; and (d) forming a second conductive layer on said second and third insulating layers to form said split gate flash memory unit.

16 Claims, 8 Drawing Sheets

STRUCTURE AND MANUFACTURING PROCESS OF A SPLIT GATE FLASH MEMORY UNIT

FIELD OF THE INVENTION

The present invention relates to the structure and manufacturing process of a split gate flash memory unit.

DESCRIPTION OF THE PRIOR ART

The well known types in read only memory family include Erasable Programmable ROM (EPROM), Electrically Erasable Programmable ROM ($E^2$PROM), Flash ROM, etc., wherein the gate structure of $E^2$PROM or Flash ROM includes a floating gate and a control gate just as those of EPROM, but due to that $E^2$PROM and Flash ROM need not to use ultra-violet light during data clearing, these two structures are therefore better than EPROM in terms of data clearing.

Furthermore, since both $E^2$PROM and Flash ROM utilize carriers for tunnelling a thin layer of $SiO_2$ underlying the floating gate to enter the floating gate, or by applying a high voltage across the tunnel oxide, and the carriers trapping within the floating gate can tunnel through said thin layer of $SiO_2$ so as to achieve the data writing and clearing. However, the structure of conventional $E^2$PROM or Flash ROM has the problem of over-erasing. In order to solve the disadvange of over-erasing, a split gate flash memory unit becomes the major structure in current $E^2$PROM and Flash ROM.

Figure 1A:
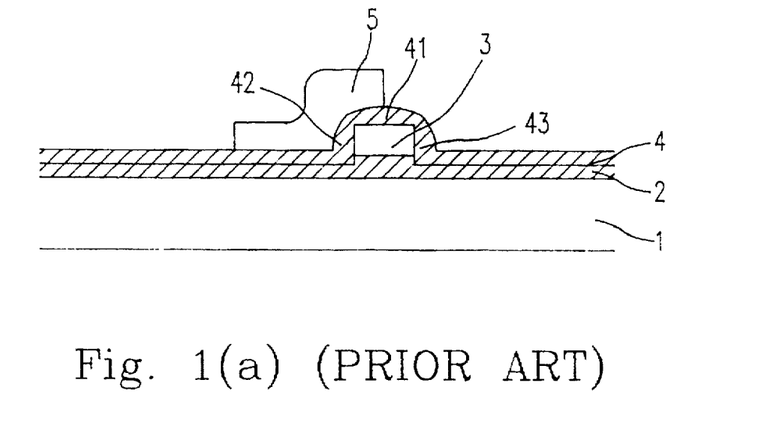
FIG. 1(a) and 1(b) are ideal and practical schematic structure diagrams of a conventional split gate flash memory unit respectively.
Figure 1B:
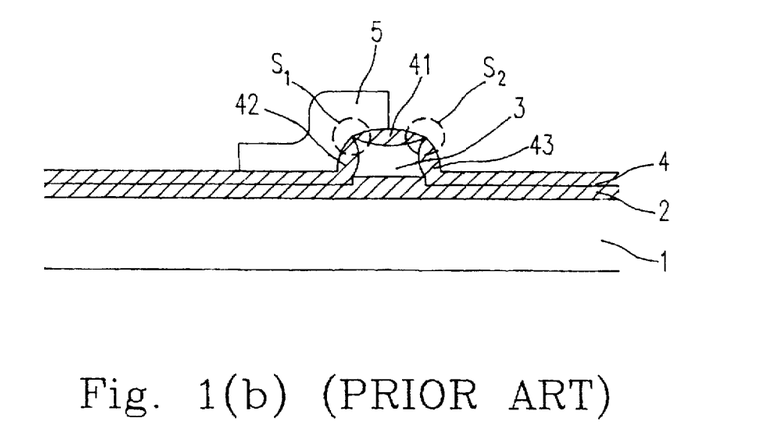

Please refer to FIG. 1(a) and 1(b), which are the schematic ideal and practical structure diagrams of conventional split gate flash memory unit respectively. The structure in FIG. 1(a) includes a silicon substrate 1, a first insulating layer 2, a floating gate 3, a second insulating layer 4, and a control gate 5. Said second insulating layer 4 is composed of an insulating layer 41 between polysilicons and oxides layers 42, 43 on left and right side walls. Said insulating layer 41 and said oxide layers 42, 43 have considerable thickness so as to provide a well blocking effect between said floating gate 3 and said control gate 5. In addition, if said first insulating layer 2 is a gate oxide layer, then said second insulating layer 4 is a tunnelling oxide layer; in contrary, if said first insulating layer 2 is a tunnelling oxide layer, then said second insulating layer 4 is a gate oxide layer.

However, practically the real situation is not so perfect as shown in FIG. 1(a). Please refer to FIG. 1(b), which is the schematic practical structure diagram of conventional split gate flash memory unit. As shown in FIG. 1(b), there also includes a silicon substrate 1, a first insulating layer 2, a floating gate 3, a second insulating layer 4, and a control gate 5. Said second insulating layer 4 is also composed of an insulating layer 41 between polysilicons and oxide layers 42, 43 on left and right side walls, but at the left and right edges ( i.e. S1 and S2 shown in FIG. 1(b) ) of said floating gate 3 an asperity is projected. Therefore, said insulating layer 41 and said oxide layers 42, 43 can not provide a well blocking effect between said floating gate 3 and said control gate 5 at said left and right edges, an asperity effect is resulted.

Moreover, due to that the electric intensity of the asperity structure shown in S1 is particularly strong, the charges in said floating gate 3 and said control gate 5 have the tendency to form a "point discharge" phenomenon through said asperity structure. Therefore, the original object to isolate said floating gate 3 and said control gate 5 can not be accomplished, and the reliability of the flash memory unit is reduced.

Figure 2A:
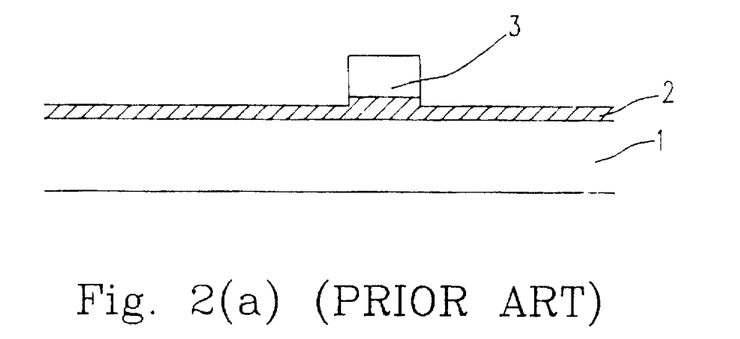
FIG. 2(a)–2(c) are the manufacturing processes of a conventional split gate flash memory unit.
Figure 2B:
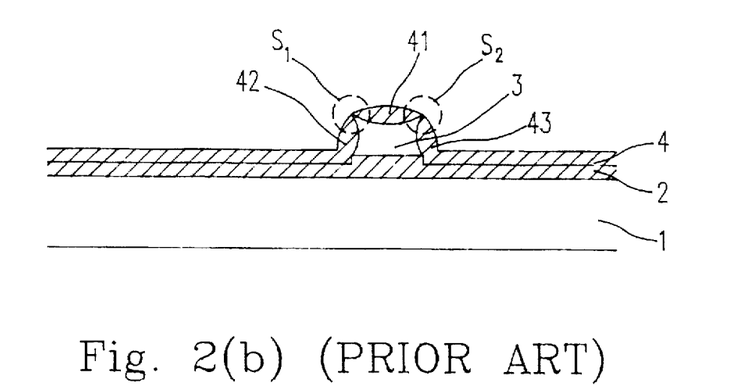
Figure 2C:
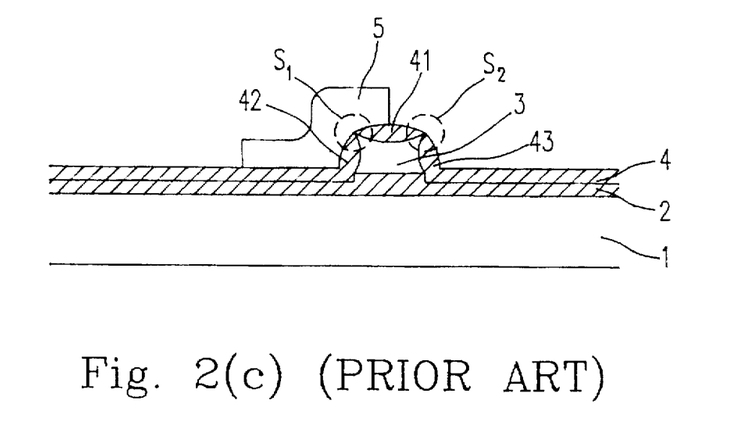

In order to further describe the manufacturing process of conventional split gate flash memory unit, please refer to FIG. 2(a)~2(c), wherein:

FIG. 2(a) includes the following steps:
  forming a first insulating layer 2 on said silicon substrate 1;
  forming a polysilicon layer (or a polycide layer) on said first insulating layer 2; and
  removing part of said polysilicon layer by photolithography and etching techniques, the polysilicon layer that remains being used as a floating gate 3.

FIG. 2(b) includes the following steps:
  performing a thermal oxidation process to form an insulating layer 41 on top surface of said floating gate 3, and form said oxide layers 42, 43 on left and right sidewalls of said floating gates 3; wherein both said oxide layer 42, 43 and said insulating layer 41 are used as an isolation layer.

Since the material stress at left and right edges S1, S2 of said floating gate 3 is stonger than other places, the oxidation rate of left and right edges S1, S2 of said floating gates 3 will be lower than that of the top surface as well as that of left and right sidewalls. Therefore, when the oxidation process is carried out, an asperity structure is formed at the left and right edges S1, S2 of said floating gate 3.

FIG. 2(c) includes the following steps:
  forming another polysilicon layer on said insulating layer 41 and said oxide layers 42, 43 of said left and right sidewalls; and
  removing part of said another polysilicon layer by photolithography and etching techniques, the polysilicon that remains being used as a control gate 5.

As mentioned above, the charges in said floating gate 3 and said control gate 5 has the tendency to form a "point discharge" phenomenon through said asperity structure, and causes that the split gate flash memory unit can not store or clear data correctly.

In brief, it is indeed that a bad isolation disadvantage exists between said floating gate 3 and said control gate 5 in conventional split gate flash memory unit. If a structure and a process can be provided to reduce or eliminate said asperity structure, then apparently the reliability of the split gate flash memory unit will be improved. The present invention is directed toward this object.

SUMMARY OF THE INVENTION

The major object of the present invention is to provide a structure of the split gate flash memory unit to reduce the asperity structure.

Another object of the present invention is to provide a manufacturing process of the split gate flash memory unit to reduce the asperity structure.

The present invention relates to the structure of a split gate flash memory unit, which comprises a silicon substrate; a first insulating layer formed on said silicon substrate; a first conductive layer formed on part area of said first insulating layer; a second insulating layer formed on left and right sidewalls of said first conductive layer and on other part area of said first insulating layer; a third insulating layer formed on said first conductive layer, wherein said third insulating layer is also formed on said second insulating layer located at said left and right side walls of the first conductive layer in order to reduce an asperity effect on left and right edges of said first conductive layer; and a second conductive layer formed on said second and third insulating layers for being isolated from said first conductive layer by a blocking function of said second and third insulating layer.

According to ideas above, wherein said first insulating layer can be a gate oxide layer.

According to ideas above, wherein the thickness of said gate oxide layer formed on said silicon substrate is at least 50 Å.

According to ideas above, wherein said second insulating layer can be a tunnelling oxide layer.

According to ideas above, wherein said tunnelling oxide layer can be a $SiO_2$ layer.

According to ideas above, wherein the thickness of said tunnelling oxide is 50 Å~120 Å.

According to ideas above, wherein said first insulating layer can be a tunnelling oxide layer.

According to ideas above, wherein said tunnelling oxide layer formed on said silicon substrate can be a $SiO_2$ layer.

According to ideas above, wherein the thickness of said tunnelling oxide layer is 50 Å~120 Å.

According to ideas above, wherein said second insulating layer can be a gate oxide layer.

According to ideas above, wherein the thickness of said gate oxide layer is at least 50 Å.

According to ideas above, wherein said first conductive layer can be a polysilicon layer.

According to ideas above, wherein said first conductive layer can be a polycide layer.

According to ideas above, wherein the thicknesss of said third insulating layer can be 30 Å~5000 Å.

According to ideas above, wherein said third insulating layer can be a nitride layer.

According to ideas above, wherein said third insulating layer can be an oxide-nitride (ON) layer.

According to ideas above, wherein said third insulating layer can be a nitride-oxide (NO) layer.

According to ideas above, wherein said third insulating layer can be an oxide-nitride-oxide (ONO) layer.

According to ideas above, wherein said third insulating layer can be an oxide-nitride-oxide-nitride (ONON) layer.

According to ideas above, wherein said second conductive layer can be a polysilicon layer.

According to ideas above, wherein there further comprises a dummy layer between said third insulating layer and said second conductive layer.

According to ideas above, wherein said dummy layer can be a nitride layer for preventing said first conductive layer from oxidation.

According to ideas above, wherein said dummy layer can be a polysilicon layer.

According to ideas above, wherein said dummy layer can be an amorphous silicon layer.

The present invention also relates to the manufacturing process of a split gate flash memory unit, which comprises the step of: (a) providing a silicon substrate having a first insulating layer, and forming a first conductive layer on said first insulating layer, and forming a third insulating layer on said first conductive layer; (b) removing part of said third insulating layer and part of said first conductive layer to expose left and right sidewalls of said first conductive layer and part area of said first insulating layer; (c) performing an oxidation process to form a second insulating layer on left and right sidewalls of said first conductive layer and on said part area of said first insulating layer, wherein by a blocking function of the third insulating layer on said second insulating layer an asperity effect on left and right edges of said first conductive layer is reduced; and (d) forming a second conductive layer on said second and third insulating layer to form said split gate flash memory unit.

According to ideas above, wherein said step (a) includes the steps of: (a1) forming an oxide layer on said silicon substrate; (a2) forming a first conductive layer on said oxide layer; and (a3) forming a third insulating layer on said first conductive layer.

According to ideas above, wherein said oxide layer in step (a1) can be a gate oxide layer.

According to ideas above, wherein the thickness of said gate oxide layer is at least 50 Å.

According to ideas above, wherein the process in forming said gate oxide layer can be a thermal oxidation process.

According to ideas above, wherein said oxide layer in step (a1) can be a tunnelling oxide layer.

According to ideas above, wherein said tunnelling oxide layer can be a $SiO_2$ layer.

According to ideas above, wherein the thickness of said tunnelling oxide layer is 50 Å~120 Å.

According to ideas above, wherein the process in forming said tunnelling oxide layer can be a chemical vapor deposition (CVD) process.

According to ideas above, wherein the process in forming said tunnelling oxide layer can be a thermal oxidation process.

According to ideas above, wherein said first conductive layer in said step (a2) can be a polysilicon layer.

According to ideas above, wherein said first conductive layer in said step (a2) can be a polycide layer.

According to ideas above, wherein the process in step (a2) to form said first conductive layer can be a chemical vapor deposition (CVD) process.

According to ideas above, wherein the process in step (a3) to form said third insulating layer can be a chemical vapor deposition (CVD) process.

According to ideas above, wherein the thickness of said third insulating layer in step (a3) can be 30 Å~5000 Å.

According to ideas above, wherein said third insulating layer in step (a3) can be a nitride layer.

According to ideas above, wherein said third insulating layer in step (a3) can be an oxide-nitride (ON) layer.

According to ideas above, wherein said third insulating layer in step (a3) can be a nitride-oxide (NO) layer.

According to ideas above, wherein said third insulating layer in step (a3) can be an oxide-nitride-oxide (ONO) layer.

According to ideas above, wherein said third insulating layer in step (a3) can be an oxide-nitride-oxide-nitride (ONON) layer.

Accoding to ideas above, wherein said step (b) includes the steps of:

(b1) forming a photoresist layer on said third insulating layer; and (b2) etching part of said third insulating layer and said first conductive layer by photolithography and etching techniques to expose left and right sidewalls of said first conductive layer as well as part of the oxide layer.

Accoding to ideas above, wherein removing part of said third insulating layer and said first conductive layer in step (b) can be done by a dry etching process.

Accoding to ideas above, wherein said oxidation process in step (c) can be a thermal oxidation process.

Accoding to ideas above, wherein said second insulating layer in step (c) can be a tunnelling oxide layer.

Accoding to ideas above, wherein said tunnelling oxide layer can be $SiO_2$ layer.

Accoding to ideas above, wherein the thickness of said tunnelling oxide layer can be 50~120 Å.

Accoding to ideas above, wherein the process of forming said tunnelling oxide layer can be done by a chemical vapor deposition (CVD) process.

Accoding to ideas above, wherein the process of forming said tunnelling oxide layer can be done by a thermal oxidation process.

Accoding to ideas above, wherein said second insulating layer in step (c) can be a gate oxide layer.

Accoding to ideas above, wherein the thickness of said gate oxide is at least 50 Å.

Accoding to ideas above, wherein the process of forming said gate oxide can be done by a thermal oxidation process.

Accoding to ideas above, wherein said step (d) includes the following steps: (d1) forming a second conductive layer on said second and third insulating layer; (d2) forming a photoresist layer on said second conductive layer; and (d3) etching part of said second conductive layer by photolithography and etching techniques to form a split gate flash memory unit.

Accoding to ideas above, wherein said second conductive layer in step (d) can be a polysilicon layer.

Accoding to ideas above, wherein forming said second conductive layer in step (d) can be done by a chemical vapor deposition process.

Accoding to ideas above, wherein before step (b) there further includes the following steps: (e) forming a dummy layer on said third insulating layer; and (f) removing part of said dummy layer and leaving part of said dummy layer on said third insulating layer.

Accoding to ideas above, wherein said dummy layer in step (e) can be a nitride layer.

Accoding to ideas above, wherein said dummy layer that remains in step (f) can be used as a masking layer in performing said oxidation process in order to protect said first conductive layer from oxidation.

Accoding to ideas above, wherein said dummy layer in step (e) can be a polysilicon layer.

Accoding to ideas above, wherein said dummy layer in step (e) can be a amorphous silicon layer.

Accoding to ideas above, wherein the process of forming said dummy layer in step (e) can be done by a chemical vapor deposition (CVD) process.

Accoding to ideas above, wherein the process of forming said dummy layer in step (e) can be done by a sputtering process.

BRIEF DESCRIPTIONS OF THE DRAWINGS

The present invention can be better understood by the following drawings and the detailed descriptions, in which.

PREFERRED EMBODIMENTS OF THE PRESENT INVENTION

Figure 3:
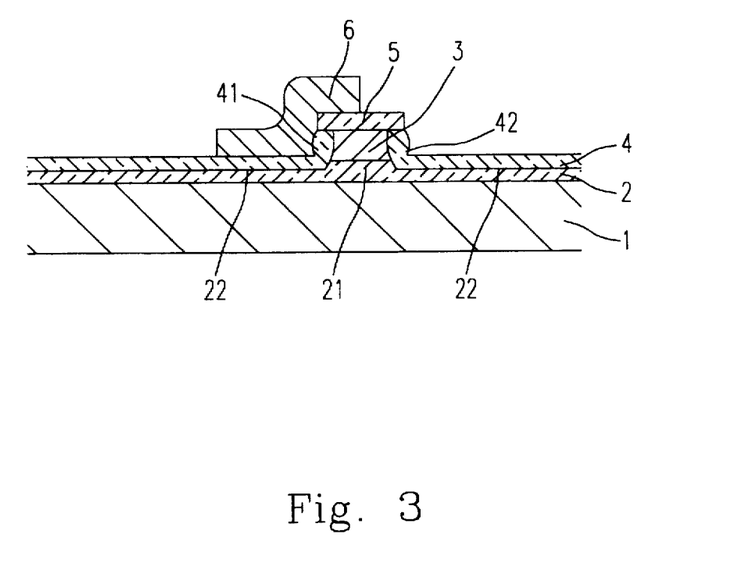
FIG. 3 is the schematic structure diagram of the first preferred embidiment of the present invention.

Please refer to FIG. 3, which is the schematic structure diagram of the first preferred embodiment of the present invention, and comprises a silicon substrate 1, a first insulating layer 2, a first conductive layer 3, a second insulating layer 4, a third insulating layer 5, and a second conductive 6; wherein said second insulating layer 4 comprises left and right sidewalls of oxide layers 41, 42.

Preferably, said first insulating layer 2 is a gate oxide layer with the thickness of at least 50 Å, and said second insulating layer 4 is a tunnelling oxide layer; wherein said tunnelling oxide layer is a $SiO_2$ layer with the thickness of 50~120 Å. Of course, said first insulating layer 2 can be a tunnelling oxide, and said second insulating layer 4 will then be a gate oxide layer.

Moreover, said first conductive layer 3 can be a polysilicon layer or a polycide layer, and said second conductive layer 6 can be a polysilicon layer.

Furthermore, said third insulating layer 5 can be a nitride layer with the thickness of 30~5000 Å. Of course, said third insulating layer 5 can also be an oxide-nitride (ON) layer, a nitride-oxide (NO) layer, an oxide-nitride-oxide (ONO) layer, or an oxide-nitride-oxide-nitride (ONON) layer, wherein the purpose of coating said oxide on and under said nitride is to avoid the material stress of said nitride to destroy said first conductive layer 3 or said second conductive layer 6, so that a first conductive layer 3 and a second conductive layer 6 with better electrical quality can be achieved.

In FIG. 3, said first insulating layer 2 is formed on said silicon substrate 1, and said first conductive layer 3 is formed on part area 21 of said first insulating layer 2, the left and right sidewalls of said first conductive layer 3 and the other part area 22 of said first insulating layer 2 is covered by said second insulating layer 4, said first conductive layer 3 is used as a floating gate. Moreover, said third insulating layer 5 is formed on said first conductive layer 3, and said second conductive layer 6 is formed on said second and third insulating layer 4, 5. By the blocking function of said second and third insulating layer 4, 5, said second conductive layer 6 is isolated with said first conductive layer 3 and served as a control gate.

The difference between the conventional split gate flash memory unit shown in FIG. 1 and that shown in FIG. 3 is that the third insulating layer 5 in FIG. 3 is further formed on oxide layers 41, 42 of the left and right sidewalls, so as to reduce considerably the asperity effect on left and right edges of said first conductive layer 3.

In order to further disclose the preferred process of the present invention in forming the structure of FIG. 3 and the reason to reduce the asperity structure, it is now described by the manufacturing process of the first preferred embodiment shown in FIG. 4(a)–4d as below.

Figure 4A:
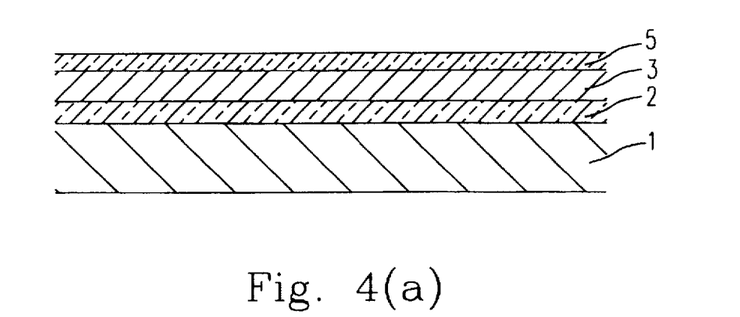
FIG. 4(a)–4(d) are the manufacturing processes of the first preferred embodiment of the present invention.

There comprises the following steps in FIG. 4(a):
forming said first insulating layer 2 on said silicon substrate 1 by a thermal oxidation or chemical vapor deposition (CVD) process; wherein said first insulating layer 2 is a gate oxide layer with the thickness of at least 50 A, or a tunnelling oxide layer with the thickness of 50–120 Å;

forming said first conductive layer 3 on said first insulating layer 2 by a chemical vapor deposition process; and forming said third insulating layer 5 with thickness of 30~5000 Å on said first conductive layer 3 by a chemical vapor deposition process.

Figure 4B:
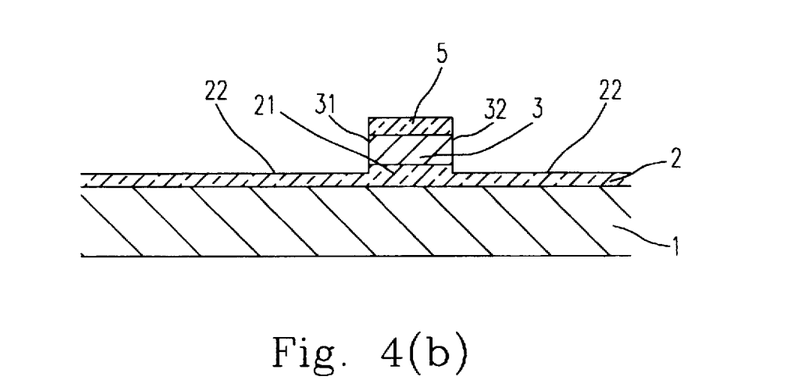

There comprises the following steps in FIG. 4(b):
  forming a photoresist layer on said third insulating layer 5;
  etching part of said third insulating layer and said first conductive layer to expose left and right sidewalls 31, 32 of said first conductive layer 3 and part area 22 of said first insulating layer 2 by photolithography and etching techniques; said etching process can be done by a dry etching process.

Figure 4C:
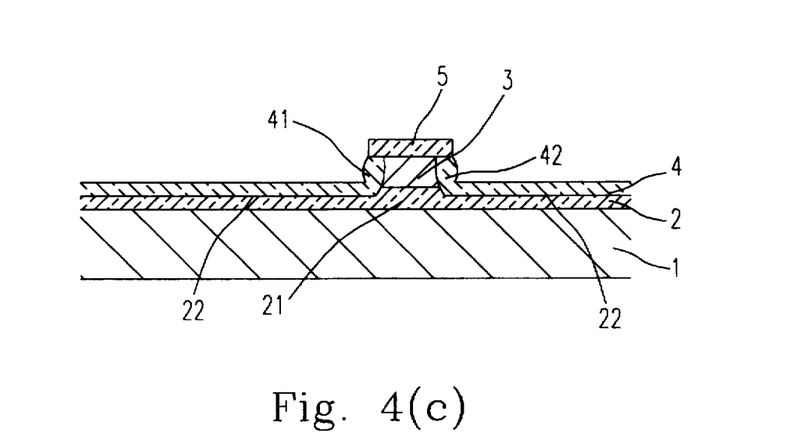

There comprises the following steps in FIG. 4(c):
  performing a thermal oxidation process to form said second insulating layer 4 on left and right sidewalls 31, 32 of said first conductive layer 3 and on part area 22 of said first insulating layer 2, wherein by means of the blocking function of the left and right edges of said third insulating layer 5 on said left and right sidewalls oxide layer 41, 42, the possibility of forming an asperity structure on the left and right edges of said first conductive layer 3 is reduced;
  said second insulating layer 4 can be a tunnelling oxide layer with the thickness of 50~120 Å, or can be a gate oxide layer with the thickness of 50 Å.

Figure 4D:
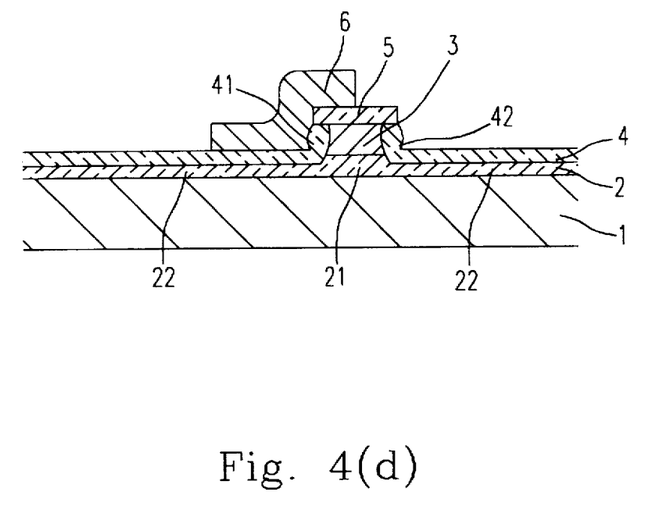

There comprises the following steps in FIG. 4(d):
  forming said second conductive layer 6 on said second and third insulating layer 4, 5 by a chemical vapor deposition process;
  forming a photoresist layer on said second conductive layer 6; and
  etching part of said second conductive layer by photolithography and etching techniques to form a split gate flash memory unit with the asperity structure being reduced.

Figure 5:
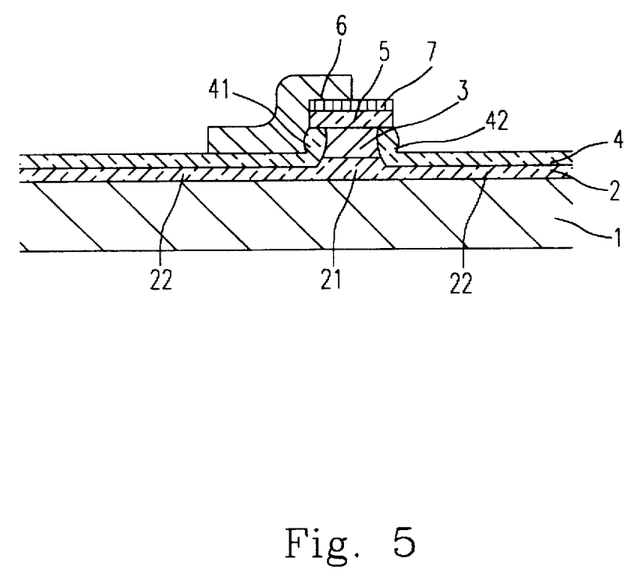
FIG. 5 is the schematic structure diagram of the second preferred embodiment of the present invention.

As to the structure of the second embodiment of the present invention, please refer to FIG. 5. Most of the structures in FIG. 5 are the same as that in FIG. 3, so the symbols in FIG. 5 just follow the symbols in FIG. 3.

The difference between FIG. 5 and FIG. 3 is that there further comprises a dummy layer 7 between said third insulating layer 5 and said second conductive layer 6, wherein said dummy layer 7 is a nitride layer for protecting said third insulating layer 5 from oxidation.

As to other preferred structures, said dummy layer 7 can be a polysilicon layer or an amorphous silicon layer.

A preferred manufacturing process in forming the structure of FIG. 5 is shown in FIG. 6(a)-6(d), and described as below.

Figure 6A:
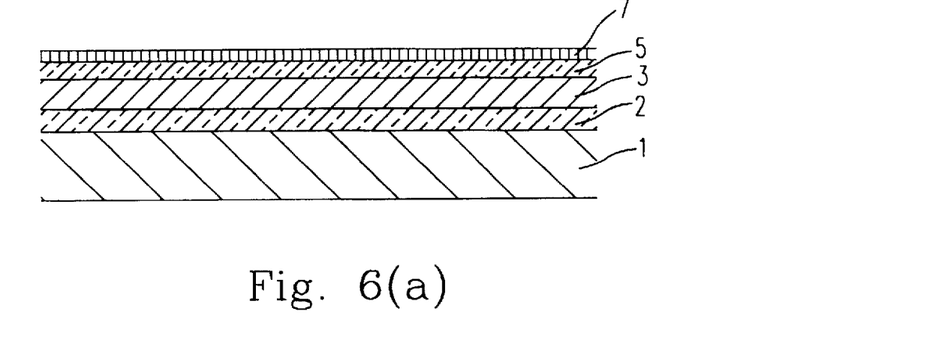
FIG. 6(a)–6(d) are the manufacturing processes of the second preferred embodiment of the present invention.

There comprises the following steps in FIG. 6(a):
  forming said first insulating layer 2 on said silicon substrate 1 by a thermal oxidation or chemical vapor deposition (CVD) process; wherein said first insulating layer 2 is a gate oxide layer with the thickness of at least 50 Å, or a tunnelling oxide layer with the thickness of 50~120 Å;
  forming said first conductive layer 3 on said first insulating layer 2 by chemical vapor deposition process;
  forming said third insulating layer 5 with thickness of 30~5000 Å on said first conductive layer 3 by a chemical vapor deposition process; and
  forming said dummy layer 7 on said third insulating layer 5 by a chemical vapor deposition or sputtering process.

Figure 6B:
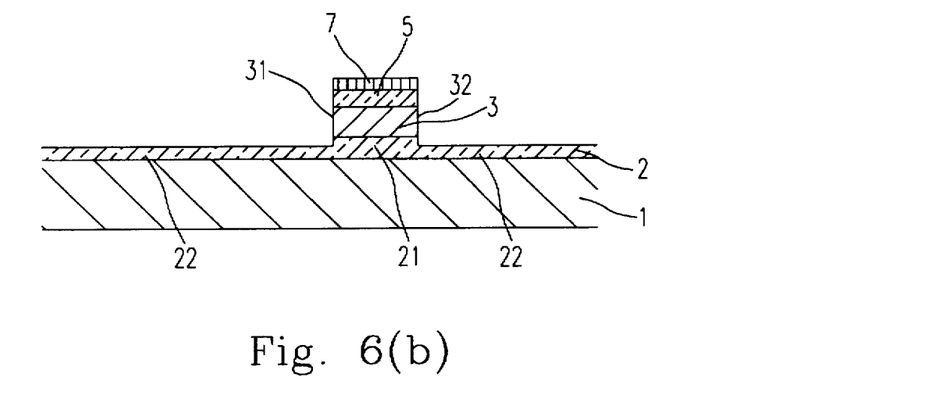

There comprises the following steps in FIG. 6(b):

forming a photoresist layer on said dummy layer 7; and
  etching part of said dummy layer, second insulating layer and first conductive layer to expose left and right sidewalls 31, 32 of said first conductive layer 3 and part area 22 of said first insulating layer 2 by photolithography and etching techniques; said etching process can be done by a dry etching process.

Figure 6C:
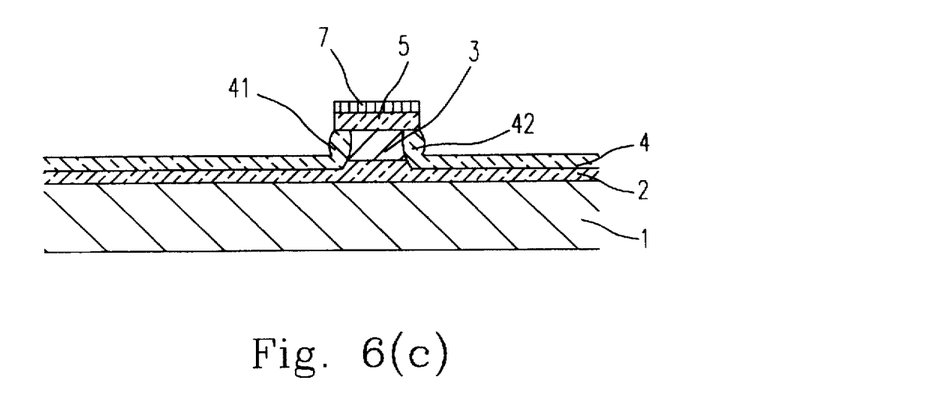

There comprises the following steps in FIG. 6(c):
  performing a thermal oxidation process to form said second insulating layer 4 on left and right sidewalls 41, 42 of said first conductive layer 3 and on part area 22 of said first insulating layer 2, wherein by means of the blocking function of the left and right edges of said dummy layer 7 and said third insulating layer 5 on said left and right sidewalls oxide layer 41, 42, the possibility of forming an asperity structure on the left and right edges of said first conductive layer 3 is reduced;
  said second insulating layer 4 can be a tunnelling oxide layer with the thickness of 50~120 Å, or can be a gate oxide layer with the thickness of 50 Å.

Figure 6D:
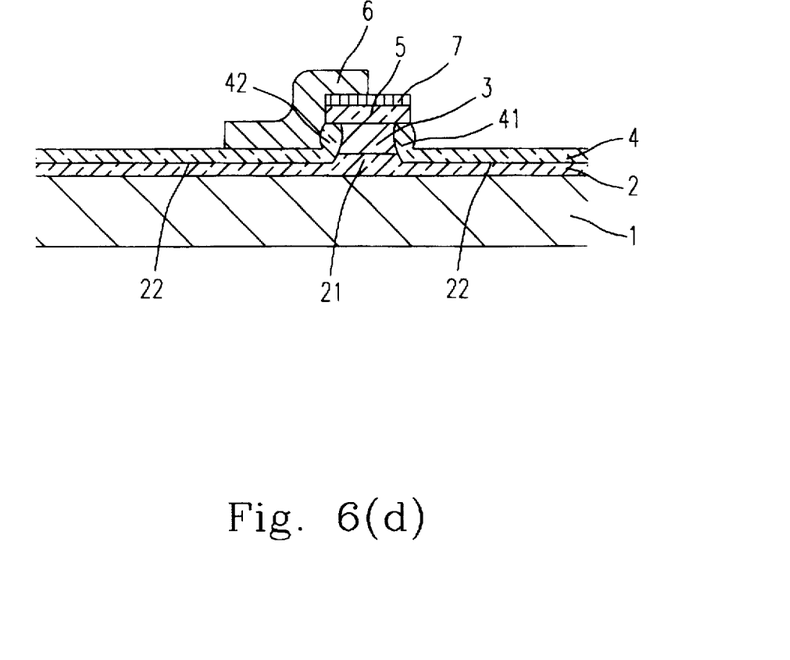

There comprises the following steps in FIG. 6(d):
  forming said second conductive layer 6 on said second insulating layer 4 and said dummy layer 7 by a chemical vapor deposition;
  forming a photoresist layer on said second conductive layer 6; and
  etching part of said second conductive layer by photolithography and etching techniques to form a split gate flash memory unit with the asperity structure being reduced.

Summing up the above, the process of the present invention forms an oxidation masking layer (e.g. said third insulating layer 5 and /or said dummy layer 7) on said first conductive layer 3 before performing the thermal oxidation so that the asperity strucyure is reduced, therefore the present invention is indeed of having industrial applicability.

The present invention can be modified by any skillful person in the art without departing the spirit and scope of the accompanying claims.

What is claimed is:

1. A process for manufacturing a split gate flash memory unit, comprising the steps of:

(a) providing a silicon substrate having a first insulating layer, and forming a first conductive layer on said first insulating layer, and forming a third insulating layer on said first conductive layer;

(b) removing part of said third insulating layer and part of said first conductive layer to expose left and right sidewalls of said first conductive layer and part area of the first insulating layer;

(c) performing an oxidation process to form a second insulating layer on left and right sidewalls of said first conductive layer and on said part area of said first insulating layer, wherein by a blocking function of said third insulating layer on said second insulating layer an asperity effect on left and right edges of said first conductive layer is reduced; and (d) forming a second conductive layer on said second and third insulating layers to form said split gate flash memory unit.

2. The process according to claim 1, wherein said step (a) includes the steps of:

(a1) forming an oxide layer on said silicon substrate;

(a2) forming a first conductive layer on said oxide layer; and (a3) forming a third insulating layer on said first conductive layer.

3. The process according to claim 2, wherein said oxide layer in said step (a1) is a gate oxide layer having a thickness of at least 50 Å, and said gate oxide layer is formed by a thermal oxidation process.

4. The process according to claim 2, wherein said oxide layer in said step (a1) is a tunnelling oxide layer having a thickness ranged from 50 Å to 120 Å, and said tunnelling oxide layer is formed by one of a chemical vapor deposition (CVD) process and a thermal oxidation process.

5. The process according to claim 2, wherein said first conductive layer in said step (a2) is one of a polysilicon layer and a polycide layer, and said first conductive layer is formed by a chemical vapor deposition (CVD) process.

6. The process according to claim 2, wherein in said step (a3), said third insulating layer is formed by a chemical vapor deposition (CVD) process, and has a thickness ranged from 30 Å to 5000 Å, and is one selected from a group consisting of a nitride layer, an oxide-nitride (ON) layer, a nitride-oxide (NO) layer, an oxide-nitride-oxide (ONO) layer and an oxide-nitride-oxide-nitride (ONON) layer.

7. The process according to claim 1, wherein said step (b) includes the steps of:

(b1) forming a photoresist layer on said third insulating layer; and (b2) etching part of said third insulating layer and said first conductive layer by photolithography and etching techniques to expose left and right sidewalls of said first conductive layer as well as part area of said first insulating layer.

8. The process according to claim 1, wherein in said step (b), part of said third insulating layer and said first conductive layer is removed by a dry etching process.

9. The process according to claim 1, wherein said oxidation process in said step (c) is a thermal oxidation process, and said second insulating layer in step (c) is a tunnelling oxide layer having a thickness ranged from 50 Å to 120 Å.

10. The process according to claim 9, wherein said tunnelling oxide layer is formed by one of a chemical vapor deposition (CVD) process and a thermal oxidation process.

11. The process according to claim 1, wherein said second insulating layer in said step (c) is a gate oxide layer having a thickness of at least 50 Å, and said gate oxide is formed by a thermal oxidation process.

12. The process according to claim 1, wherein said step (d) includes the following steps:

(d1) forming a second conductive layer on said second and third insulating layers;

(d2) forming a photoresist layer on said second conductive layer; and (d3) etching part of said second conductive layer by photolithography and etching techniques to form said split gate flash memory unit.

13. The process according to claim 1, wherein said second conductive layer in said step (d) is a polysilicon layer, and is formed by a chemical vapor deposition process.

14. The process according to claim 1, wherein before said step (b) said process further includes the following steps:

(e) forming a dummy layer on said third insulating layer; and (f) removing part of said dummy layer and leaving part of said dummy layer on said third insulating layer.

15. The process according to claim 14, wherein said dummy layer in said step (e) is one selected from a group consisting of a nitride layer, a polysilicon layer and an amorphous silicon layer, and is formed by one of a chemical vapor deposition (CVD) process and a sputtering process.

16. The process according to claim 14, wherein said dummy layer that remains in said step (f) is used as a masking layer in performing said oxidation process to protect said first conductive layer from oxidation.

* * * * *